(12) United States Patent
Sarkozy et al.

(10) Patent No.: US 8,304,916 B1
(45) Date of Patent: Nov. 6, 2012

(54) HALF-THROUGH VIAS FOR SUPPRESSION OF SUBSTRATE MODES

(75) Inventors: Stephen J. Sarkozy, Redondo Beach, CA (US); Xiaobing Mei, Manhatten Beach, CA (US); William R. Deal, Manhatten Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 13/177,348

(22) Filed: Jul. 6, 2011

(51) Int. Cl.
*H01L 23/52* (2006.01)
(52) U.S. Cl. ............................ 257/774; 257/E23.011
(58) Field of Classification Search ............ 257/774, 257/E23.011, E23.067, E23.174
See application file for complete search history.

(56) References Cited

U.S. PATENT DOCUMENTS

| | | | |
|---|---|---|---|
| 5,347,149 A * | 9/1994 | Bayraktaroglu | ............. 257/192 |
| 5,496,755 A | 3/1996 | Bayraktaroglu | |
| 5,511,428 A * | 4/1996 | Goldberg et al. | .............. 73/777 |
| 5,759,911 A | 6/1998 | Cronin | |
| 5,976,963 A | 11/1999 | Cronin | |
| 6,051,479 A | 4/2000 | Hong | |
| 6,124,179 A | 9/2000 | Adamic, Jr. | |
| 6,764,955 B2 | 7/2004 | Jeon | |
| 6,878,608 B2 | 4/2005 | Brofman | |
| 6,898,851 B2 | 5/2005 | Nishioka | |
| 7,122,463 B2 | 10/2006 | Ohuchi | |
| 7,834,461 B2 | 11/2010 | Asai | |
| 2002/0117681 A1* | 8/2002 | Weeks et al. | ................. 257/106 |
| 2009/0045502 A1* | 2/2009 | Adkisson et al. | ............. 257/693 |
| 2009/0267232 A1* | 10/2009 | Morel et al. | ................. 257/758 |
| 2010/0140805 A1* | 6/2010 | Chang et al. | ................. 257/773 |

FOREIGN PATENT DOCUMENTS

| JP | 6243200 A | 9/1994 |
|---|---|---|
| JP | 2006344816 A | 12/2006 |

* cited by examiner

*Primary Examiner* — Thao P. Le
(74) *Attorney, Agent, or Firm* — John A. Miller; Miller IP Group, PLC

(57) ABSTRACT

An integrated circuit comprising a substrate including a top-side surface and a backside surface and a plurality of circuit components fabricated on the top-side surface of the substrate. The circuit includes a plurality of electrically conductive vias extending into the substrate from the backside surface of the substrate. Some of the plurality of vias are through vias that extend completely through the substrate and make electrical contact with a circuit component on the top-side surface of the substrate and some of the plurality of vias are part-way through vias that extend only part-way through the substrate and are positioned directly opposite to a circuit component on the top-side surface of the substrate, where the part-way through vias extend at least half-way through the substrate. The number of part-way through vias is determined based on the number of part-way through vias that are necessary to suppress substrate modes in the substrate.

19 Claims, 1 Drawing Sheet

HALF-THROUGH VIAS FOR SUPPRESSION OF SUBSTRATE MODES

GOVERNMENT CONTRACT

The U.S. Government may have a paid-up license in this invention and the right in limited circumstances to require the patent owner to license others on reasonable terms as provided for by the terms of Contract No. HR0011-09-C-0062 awarded by DARPA.

BACKGROUND

1. Field of the Invention

This invention relates generally to an integrated circuit including a substrate having part-way through vias and, more particularly, to an integrated circuit including a dense configuration of integrated circuit components formed on a top-side of a substrate and plurality of part-way through vias formed through a back side of the substrate and opposite to the circuit components, where the part-way through vias operate to suppress substrate modes.

2. Discussion of the Related Art

Integrated circuits are typically fabricated by epitaxial fabrication processes that deposit various semiconductor layers on a semiconductor substrate to define the circuit components. As integrated circuit fabrication techniques advance and become more complex, more circuit components are able to be fabricated on the substrate within the same area and be more closely spaced together. Further, these integrated circuit fabrication techniques allow the operating frequencies of the circuit to increase to very high frequencies, well into the GHz range.

Substrates for integrated circuits are made of various semiconductor materials, such as silicon, InP, GaAs, etc., that promote substrate signal propagation modes that allow the RF signals used by the circuit to propagate through the substrate. Particularly, high refractive index epitaxial layers can act as parasitic waveguides and allow signal propagation. These substrate signal propagation modes can significantly attenuate certain frequencies, such as frequencies in the 550-1000 GHz range, and cause severe signal losses. Because the substrate modes attenuate the signal propagation, it may be necessary to increase the power required to transmit the signals through the circuit, which has power limitation drawbacks.

Signal propagation modes in the substrate can be reduced, or eliminated, by decreasing the thickness of the substrate, where the reduction of the thickness of the substrate would be inversely proportional to the operating frequency of the circuit to be effective. A thinner substrate reduces the area through which the substrate modes can propagate. However, fabrication techniques limit how thin the substrate can be, where the fabrication limits of the substrate thickness is typically reached before the fabrication limit of the circuit operating frequency.

One way to overcome signal propagation modes in the substrate is to provide more metal vias extending through the substrate that act to suppress the substrate modes. Particularly, by placing conductive elements in the path of the signal propagation modes, the modes are broken up, which reduces their ability to allow propagation of the signal. As the frequency of the circuit goes up, the number of vias that are required to suppress the substrate modes goes up proportionally, assuming that the thickness of the substrate remains constant. For example, when doubling the operating frequency of the circuit, the number of vias also needs to be doubled. Further, as the frequency of the circuit goes up, the density of the components required to operate at that frequency also goes up. However, the density of the circuit components fabricated on the top-side of the substrate limits the number of vias that can be formed through the substrate without inferring with the components.

DETAILED DESCRIPTION OF THE EMBODIMENTS

The following discussion of the embodiments of the invention directed to an integrated circuit including part-way through vias formed in a substrate to reduce or eliminate signal propagation modes is merely exemplary in nature, and is in no way intended to limit the invention or its applications or uses.

Figure 1:
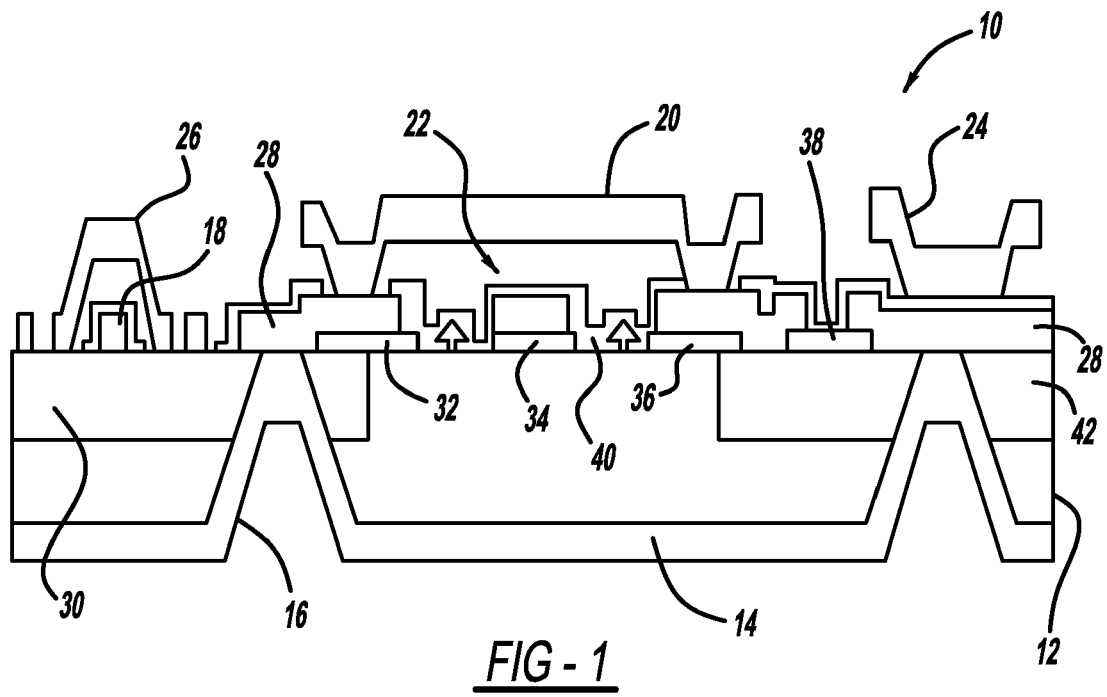
FIG. 1 is a cross-sectional view of an integrated circuit including integrated circuit components formed on a substrate and backside vias formed through the substrate.

FIG. 1 is a cross-sectional view of an integrated circuit 10 including a semiconductor substrate 12, where the operating frequency of the circuit 10 could be in the GHz range. The substrate 12 can be any substrate suitable for an integrated circuit, such as silicon, InP, GaAs, GaN, etc. In one non-limiting embodiment, the substrate 12 has a thickness in the range of 1-10 μm. The circuit 10 includes a backside metal layer 14 that is deposited on a backside surface of the substrate 12 and within etched openings to provide metalized vias 16 extending completely through the substrate 12. A plurality of circuit components, such as contacts 24, air bridges 20 and 26, coils 18, thin film resistors (TFR) 38, a high electron mobility transistor (HEMT) 22, etc., are formed on a top-side surface of the substrate 12. The HEMT 22 includes a source terminal 32, a gate terminal 34 and a drain terminal 36 all covered by a passivation layer 40. The source terminal 32 is in electrical contact with an embedded layer 42 and the drain terminal 36 is an electrical contact with an embedded layer 40 in the substrate 12. The integrated circuit components also include metal traces 28 that provide connections between the various components, including the metalized vias 16. As shown, the density of the various components on the top side of the substrate 12 limits the number of the vias 16 that can be formed through the substrate 12 because the vias 16 would need to make contact with a metalized layer or signal trace on the top-side surface of the substrate 12.

Figure 2:
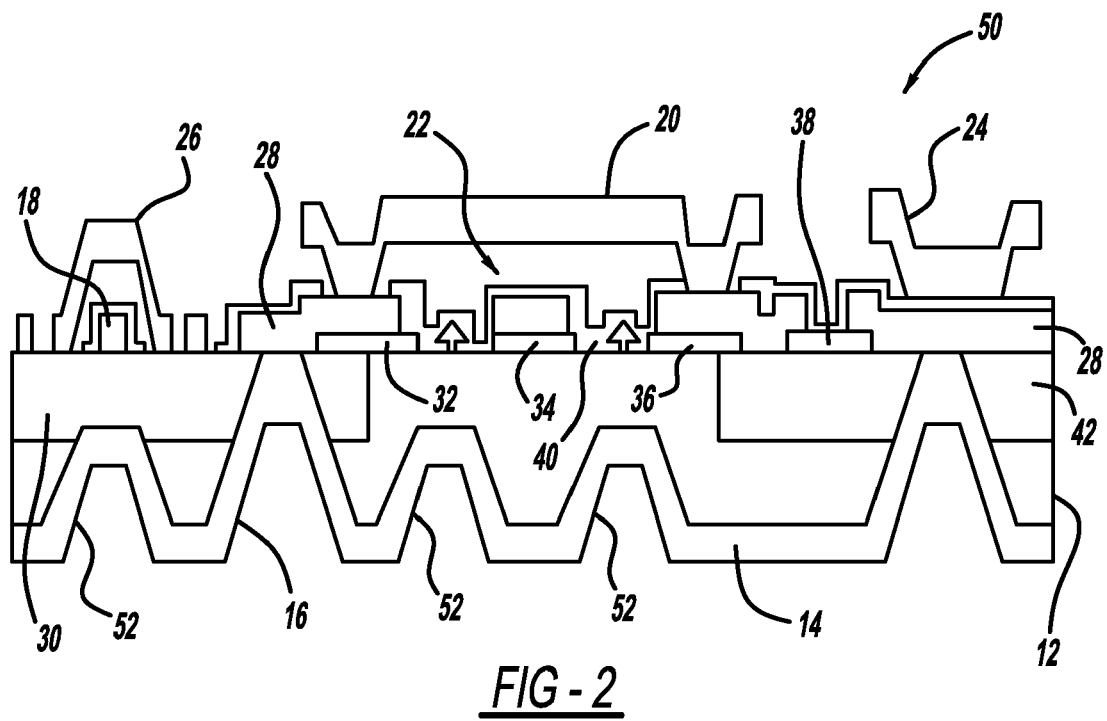
FIG. 2 is a cross-sectional view of an integrated circuit similar to the integrated circuit shown in FIG. 1 and including backside vias formed part-way through the substrate.

FIG. 2 is a cross-sectional view of an integrated circuit 50 similar to the integrated circuit 10, where like elements are identified by the same reference number. As discussed above, for certain signal propagation frequencies, substrate propagation modes in the substrate 12 allow the operating frequency of the circuit signals to propagate therethrough, which causes signal loss. That signal mode attenuation can be eliminated by increasing the number of the vias 16 to a level determined based on the operating frequency and the thickness of the substrate 12. However, that number of the vias 16 sometimes cannot be achieved because of the density and the number of the circuit components on the top-side of the substrate 12.

In order to help overcome this problem, the circuit 50 includes a number of part-way through metalized vias 52 that extend some distance into the substrate 12 from the backside of the substrate 12, but not all the way to the top-side surface of the substrate 12 where they would otherwise make electrical contact with one of the components thereon. In order to be effective, the part-way through vias 52 would need to extend well into the substrate 12 and be as close to the top-side surface of the substrate 12 as possible, which would depend on the fabrication limitations of the circuit 50. The closer the vias 52 can be placed to the signal path through the circuit 50 the better they will operate to suppress the substrate modes that would otherwise attenuate that signal. It is believed that in order to be effective, the vias 52 would have to be at least half-way through the substrate 12. Therefore, the number of the part-way through vias 52 that would be needed to suppress the substrate modes would depend on how far the vias go through the substrate 12. Simulations can be used based on the operating frequency of the circuit 10, the material of the substrate 12 and the thickness of the substrate 12 to determine how many of the vias 52 would be necessary and how deep the vias would need to be to suppress the substrate modes to prevent signal attenuation.

Any suitable fabrication technique can be employed to form both the conductive vias 16 and the part-way through vias 52 during fabrication process of the circuit 50. In one applicable technique, two different mask layers can be employed in conjunction with known photolithography and etching techniques to first form the metalized vias 16 using one mask layer and then form the part-way through vias 52 using another mask layer. In another technique, a single mask layer can be employed to form both the vias 16 and the part-way through vias 52, where the part-way through vias 52 have a narrower aspect ratio, and where the technique would use a geometrically dependent etch rate control to control what etches are all the way through.

The foregoing discussion discloses and describes merely exemplary embodiments. One skilled in the art will readily recognize from such discussion, and from the accompanying drawings and claims, that various changes, modifications and variations can be made therein without departing from the spirit and scope of the disclosure as defined in the following claims.

What is claimed is:

1. An integrated circuit comprising:
    a semiconductor substrate including a top-side surface and a backside surface;
    a plurality of integrated circuit components fabricated on the top-side surface of the substrate; and
    a plurality of electrically conductive vias extending into the substrate from the backside surface of the substrate, wherein some of the plurality of vias are through vias that extend completely through the substrate and make electrical contact with a circuit component on the top-side surface of the substrate and some of the plurality of vias are part-way through vias that extend only part-way through the substrate and are positioned directly opposite to a circuit component on the top-side surface of the substrate.

2. The integrated circuit according to claim 1 wherein the part-way through vias extend about half-way through the substrate.

3. The integrated circuit according to claim 1 wherein the part-way through vias extend more than half-way through the substrate.

4. The integrated circuit according to claim 1 wherein the number of part-way through vias is determined based on the number of through vias, a thickness of the substrate, a material of the substrate and an operating frequency of the circuit.

5. The integrated circuit according to claim 1 wherein the number of part-way through vias is determined based on the number of part-way through vias that are necessary to suppress substrate propagation modes in the substrate.

6. The integrated circuit according to claim 1 wherein the plurality of conductive vias are electrically part of a backside metal on the substrate.

7. The integrated circuit according to claim 6 wherein the plurality of conductive vias are etched into the substrate and then metalized.

8. The integrated circuit according to claim 1 wherein the substrate is made of a semiconductor material selected from the group consisting of GaAs, InP and GaN.

9. The integrated circuit according to claim 1 wherein the circuit components that are directly opposite to the part-way through vias include transistors, inductors and thin film resistors.

10. The integrated circuit according to claim 1 wherein the substrate has a thickness in the 1-10 µm range.

11. The integrated circuit according to claim 1 wherein the integrated circuit has an operating frequency in the GHz range.

12. An integrated circuit comprising:
    a semiconductor substrate including a top-side surface and a backside surface;
    a plurality of integrated circuit components fabricated on the top-side surface of the substrate; and
    a plurality of electrically conductive vias extending into the substrate from the backside surface of the substrate, said plurality of conductive vias being etched vias into the substrate and then metalized as part of a backside metal on the substrate, wherein some of the plurality of vias are through vias that extend completely through the substrate and make electrical contact with a circuit component on the top-side surface of the substrate and some of the plurality of vias are part-way through vias that extend only part-way through the substrate and are positioned directly opposite to a circuit component on the top-side surface of the substrate, said part-way through vias extending at least half-way through the substrate, wherein the number of part-way through vias is determined based on the number of part-way through vias that are necessary to suppress substrate modes in the substrate.

13. The integrated circuit according to claim 12 wherein the number of part-way through vias is also determined based on the number of through vias, a thickness of the substrate, a material of the substrate and an operating frequency of the circuit.

14. The integrated circuit according to claim 12 wherein the circuit components that are directly opposite to the part-way through vias include transistors, inductors and thin film resistors.

15. The integrated circuit according to claim 12 wherein the substrate is made of a semiconductor material selected from the group consisting of GaAs, InP and GaN.

16. A method for fabricating an integrated circuit, said method comprising:
    providing a semiconductor substrate including a top-side surface and a backside surface;
    forming a plurality of integrated circuit components on the top-side surface of the substrate; and
    forming a plurality of electrically conductive vias extending into the substrate from the backside surface of the substrate, wherein some of the plurality of vias are through vias that extend completely through the substrate and make electrical contact with a circuit component on the top-side surface of the substrate and some of the plurality of vias are part-way through vias that extend only part-way through the substrate and are positioned directly opposite to a circuit component on the top-side surface of the substrate.

17. The method according to claim 16 wherein the number of part-way through vias is determined based on the number of through vias, a thickness of the substrate, a material of the substrate and an operating frequency of the circuit.

18. The method according to claim 16 wherein the number of part-way through vias is determined based on the number of part-way through vias that are necessary to suppress substrate propagation modes in the substrate.

19. The method according to claim 16 wherein the part-way through vias extend at least half-way through the substrate.

* * * * *